(12) United States Patent
Takada et al.

(10) Patent No.: US 11,257,779 B2
(45) Date of Patent: Feb. 22, 2022

(54) MULTILAYER WIRING BOARD, ELECTRONIC DEVICE AND METHOD FOR PRODUCING MULTILAYER WIRING BOARD

(71) Applicant: Murata Manufacturing Co., Ltd., Nagaokakyo (JP)

(72) Inventors: Ryosuke Takada, Nagaokakyo (JP); Toshitaka Hayashi, Nagaokakyo (JP); Hiromasa Koyama, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/694,053

(22) Filed: Nov. 25, 2019

(65) Prior Publication Data
US 2020/0091104 A1    Mar. 19, 2020

Related U.S. Application Data

(63) Continuation of application No. PCT/JP2018/019120, filed on May 17, 2018.

(30) Foreign Application Priority Data

May 26, 2017  (JP) .............................. JP2017-104749
Oct. 3, 2017    (JP) .............................. JP2017-193537

(51) Int. Cl.
*H05K 1/11*    (2006.01)
*H01L 23/00*   (2006.01)
*H05K 1/02*    (2006.01)

(52) U.S. Cl.
CPC .......... *H01L 24/29* (2013.01); *H05K 1/0298* (2013.01); *H05K 1/115* (2013.01); *H05K 1/116* (2013.01);
(Continued)

(58) Field of Classification Search
CPC .......... H01L 24/29; H01L 2224/29147; H01L 2924/142; H01L 2224/16227; H01L 24/16;
(Continued)

(56) References Cited

U.S. PATENT DOCUMENTS 5,259,110 A      11/1993  Bross et al.
5,939,789 A *    8/1999   Kawai ................. H01L 21/4857
                                                                257/741
(Continued)

FOREIGN PATENT DOCUMENTS

JP         06-21649 A        1/1994
JP         11-204943 A       7/1999
(Continued)

OTHER PUBLICATIONS

Official Communication issued in International Patent Application No. PCT/JP2018/019120, dated Aug. 14, 2018.

*Primary Examiner* — Steven T Sawyer
(74) *Attorney, Agent, or Firm* — Keating & Bennett, LLP

(57) ABSTRACT

A multilayer wiring board includes a first insulating layer, a second insulating layer stacked on the first insulating layer, a via conductor inside each of the first insulating layer and the second insulating layer, and a conductive bonding layer that bonds the via conductors to each other. The first insulating layer is directly bonded to the second insulating layer, and a relationship $a_1 > b_1$ is satisfied, where $a_1$ is a maximum diameter of the bonding layer and $b_1$ is a maximum diameter of the via conductor at an interface with the bonding layer.

30 Claims, 8 Drawing Sheets

(52) U.S. Cl.
CPC .............. *H01L 2224/29147* (2013.01); *H05K 2201/096* (2013.01)

(58) Field of Classification Search
CPC .... H05K 3/4046; H05K 1/0298; H05K 1/115; H05K 2201/10242; H05K 2201/096; H05K 2201/09563; H05K 3/4647; H05K 3/429; H05K 2201/09481; H05K 1/111–113; H05K 3/462; H05K 2203/0733; H05K 2203/135; H05K 3/4658; H05K 3/4623; H05K 3/386; H05K 3/064; H05K 3/321; H05K 2201/0394; H05K 3/423; H05K 2201/0355; H05K 2201/0195; H05K 1/116; A01D 11/06; Y10T 29/49165; Y10T 29/49155

See application file for complete search history.

(56) References Cited

U.S. PATENT DOCUMENTS

| | | | |
|---|---|---|---|
| 6,136,419 A | 10/2000 | Fasano et al. | |
| 2002/0189861 A1* | 12/2002 | Hall | H05K 3/4046 174/262 |
| 2003/0196833 A1 | 10/2003 | Fujii et al. | |
| 2004/0000425 A1 | 1/2004 | White et al. | |
| 2004/0163964 A1 | 8/2004 | Egitto et al. | |
| 2008/0160183 A1* | 7/2008 | Ide | H01B 1/08 427/126.5 |
| 2008/0168652 A1* | 7/2008 | Koyama | H05K 3/462 29/830 |
| 2009/0243046 A1* | 10/2009 | Shi | H01L 24/27 257/621 |
| 2010/0096178 A1* | 4/2010 | Kim | H05K 3/4061 174/264 |
| 2011/0084372 A1* | 4/2011 | Su | H01L 21/6835 257/676 |
| 2012/0153463 A1* | 6/2012 | Maeda | H01L 23/49822 257/737 |
| 2013/0105980 A1 | 5/2013 | Yasuda et al. | |
| 2014/0060893 A1* | 3/2014 | Lee | H05K 1/0298 174/251 |
| 2014/0138134 A1* | 5/2014 | Imafuji | H05K 1/111 174/257 |
| 2015/0009639 A1* | 1/2015 | Papakos | H05K 7/1427 361/752 |
| 2016/0255717 A1* | 9/2016 | Furutani | H05K 1/0271 361/783 |
| 2016/0338201 A1 | 11/2016 | Kiyono et al. | |
| 2018/0014403 A1* | 1/2018 | Kasuga | H05K 1/09 |
| 2018/0326542 A1* | 11/2018 | Sakai | C22C 13/00 |
| 2019/0139915 A1* | 5/2019 | Dalmia | H01L 24/09 |

FOREIGN PATENT DOCUMENTS

| | | |
|---|---|---|
| JP | 2000-357874 A | 12/2000 |
| JP | 2001-160686 A | 6/2001 |
| JP | 2003-318545 A | 11/2003 |
| JP | 2004-260164 A | 9/2004 |
| JP | 2005-119264 A | 5/2005 |
| JP | 2006-521708 A | 9/2006 |
| JP | 2013-091835 A | 5/2013 |
| JP | 2014-049732 A | 3/2014 |
| WO | 2015/118982 A1 | 8/2015 |

* cited by examiner

MULTILAYER WIRING BOARD, ELECTRONIC DEVICE AND METHOD FOR PRODUCING MULTILAYER WIRING BOARD

CROSS REFERENCE TO RELATED APPLICATIONS

This application claims the benefit of priority to Japanese Patent Application No. 2017-104749 filed on May 26, 2017 and Japanese Patent Application No. 2017-193537 filed on Oct. 3, 2017, and is a Continuation Application of PCT Application No. PCT/JP2018/019120 filed on May 17, 2018. The entire contents of each application are hereby incorporated herein by reference.

BACKGROUND OF THE INVENTION

1. Field of the Invention

The present invention relates to a multilayer wiring board, an electronic device, and a method of producing the multilayer wiring board.

2. Description of the Related Art

Examples of multilayer wiring boards for use in various electronic devices include an electric circuit board disclosed in JP H11-204943 A which includes multiple insulating films in a stack, a conductive pattern provided at each insulating film, and an adhesive layer for adhesion between the insulating films in a stack. In the electric circuit board disclosed in JP H11-204943 A, each conductive pattern includes a portion penetrating through the insulating film, the conductive pattern of at least one insulating film among the multiple insulating films is connected to at least one of the conductive patterns of insulating films above and below the at least one insulating film, and an alloy layer is formed at the connection portion.

Generally, in a multilayer wiring board, via conductors are formed inside respective insulating layers in a stack, and the via conductors are connected to each other. A conductive wiring layer is formed on the surface of each insulating layer, and connected to a via conductor formed inside another insulating layer.

As described above, in the multilayer wiring board, such as the electric circuit board disclosed in JP H11-204943 A, the insulating layers in a stack are adhered together with an adhesive layer. Yet, height reduction is required for multilayer wiring boards, and the presence of adhesive layers interferes with height reduction. When a multilayer wiring board is produced without including adhesive layers, material of insulating layers may flow into the space between via conductors or between a conductive wiring layer and a via conductor. In this case, the via conductors may have higher resistance or cracking may occur at the interface between these components.

SUMMARY OF THE INVENTION

Preferred embodiments of the present invention provide multilayer wiring boards that are each capable of preventing materials of insulating layers from flowing into a space between via conductors or between a conductive wiring layer and a via conductor, electronic devices each including a multilayer wiring board according to a preferred embodiment of the present invention as an interposer, and methods of producing the multilayer wiring boards.

A first preferred embodiment of the present invention provides a multilayer wiring board including a first insulating layer; a second insulating layer stacked on the first insulating layer; a via conductor inside each of the first insulating layer and the second insulating layer; and a conductive bonding layer to bond the via conductors to each other, wherein the first insulating layer is directly bonded to the second insulating layer, and a relationship $a_1 > b_1$ is satisfied, where $a_1$ is the maximum diameter of the bonding layer and $b_1$ is the maximum diameter of the via conductor at an interface with the bonding layer.

In the first preferred embodiment of the present invention, preferably, a relationship $t_1 < T_1$ is satisfied, where $t_1$ is the maximum thickness of the bonding layer, and $T_1$ is the maximum thickness of the via conductor.

According to a second preferred embodiment of the present invention, a multilayer wiring board includes a first insulating layer; a third insulating layer stacked on the first insulating layer; a conductive wiring layer on a surface of the first insulating layer on the side facing the third insulating layer; a via conductor inside the third insulating layer; and a conductive bonding layer to bond the conductive wiring layer to the via conductor, wherein the first insulating layer is directly bonded to the third insulating layer, and a relationship $a_2 > b_2$ is satisfied, where $a_2$ is the maximum diameter of the bonding layer, and $b_2$ is the maximum diameter of the via conductor at its interface with the bonding layer.

In the second preferred embodiment of the present invention, preferably, a relationship $t_2 < T_2$ is satisfied, where $t_2$ is the maximum thickness of the bonding layer, and $T_2$ is the maximum thickness of the via conductor.

Hereinafter, the multilayer wiring boards according to the first and second preferred embodiments of the present invention are each simply referred to as "a multilayer wiring board of a preferred embodiment of the present invention" when no particular distinction is made therebetween.

In a multilayer wiring board of a preferred embodiment of the present invention, preferably, the bonding layer includes an intermetallic compound layer M including a Cu component and a Sn component at least at its interface with the via conductor or the conductive wiring layer.

In a multilayer wiring board of a preferred embodiment of the present invention, preferably, the bonding layer sequentially includes an intermetallic compound layer M including a Cu component and a Sn component, an intermetallic compound layer N including a Cu component and one of a Ni component or Mn component, and the intermetallic compound layer M.

In a multilayer wiring board of a preferred embodiment of the present invention, preferably, the bonding layer includes a sintered metal layer including at least one of Cu or Ag.

In a multilayer wiring board of a preferred embodiment of the present invention, preferably, interfacial metal bonding is achieved between the via conductor or the conductive wiring layer and the sintered metal layer.

In a multilayer wiring board of a preferred embodiment of the present invention, preferably, the sintered metal layer is made of a sintered body of a first metal and a second metal, the first metal and the second metal are each independently Cu or Ag, and particles of the first metal are dispersed in a sea-island configuration in the second metal.

In a multilayer wiring board of a preferred embodiment of the present invention, preferably, the sintered metal layer is made of sintered Cu particles having an average crystallite diameter of about 60 nm or more and about 150 nm or less.

In a multilayer wiring board of a preferred embodiment of the present invention, preferably, the insulating layer including the via conductor is made of a thermoplastic resin.

In a multilayer wiring board of a preferred embodiment of the present invention, preferably, the via conductor has a metal content of about 99 wt % or more.

In a multilayer wiring board of a preferred embodiment of the present invention, the first insulating layer and the second insulating layer each may include one layer. In this case, preferably, the via conductor inside the first insulating layer and the via conductor inside the second insulating layer are each made of plated metal.

In a multilayer wiring board of a preferred embodiment of the present invention, one of the first insulating layer or the second insulating layer may include one layer, and the other insulating layer may include two or more layers. In this case, preferably, the via conductor inside the insulating layer including one layer is made of plated metal, and the via conductor inside the insulating layer including two or more layers is a metal pin.

In a multilayer wiring board of a preferred embodiment of the present invention, the third insulating layer may include one layer. In this case, preferably, the via conductor inside the third insulating layer is made of plated metal.

In a multilayer wiring board of a preferred embodiment of the present invention, the third insulating layer may include two or more layers. In this case, preferably, the via conductor inside the third insulating layer is a metal pin.

In a multilayer wiring board of a preferred embodiment of the present invention, the multilayer wiring board may have an overall thickness greater than the overall width thereof.

A preferred embodiment of the present invention provides an electronic device including a first circuit board; a second circuit board; and an interposer between the first circuit board and the second circuit board, the interposer including multiple terminals, wherein the interposer is a multilayer wiring board of a preferred embodiment of the present invention, and the first circuit board and the second circuit board are electrically connected to the via conductors in the multilayer wiring board.

In an electronic device of a preferred embodiment of the present invention, preferably, the interposer allows high frequency signals to pass therethrough.

In an electronic device of a preferred embodiment of the present invention, for example, the first circuit board is an antenna, and the second circuit board is a control board on which a high frequency integrated circuit is mounted.

A preferred embodiment of the present invention provides a method of producing the above-described multilayer wiring board, including preparing an insulating sheet with conductive foil attached to one surfaces thereof and a protection film attached to another surface thereof; forming, from the protection film side, an opening that penetrates through the protection film and also forming a via hole that penetrates through the insulating sheet to the conductive foil; forming a via conductor in the via hole in the insulating sheet; forming a conductive paste layer having a maximum diameter greater than the maximum diameter of the via conductor exposed to a surface of the insulating sheet by applying a conductive paste to the via conductor; and stacking multiple insulating sheets each including the via conductor and the conductive paste layer, and collectively compressing these insulating sheets by heat treatment.

In a method of producing the multilayer wiring board of a preferred embodiment of the present invention, preferably, the forming a conductive paste layer includes filling the opening in the protection film with the conductive paste to form the conductive paste layer and then removing the protection film.

In a method of producing the multilayer wiring board of a preferred embodiment of the present invention, preferably, the opening in the protection film and the via hole in the insulating sheet each have a tapered shape whose diameter decreases toward the conductive foil.

In a method of producing the multilayer wiring board of a preferred embodiment of the present invention, preferably, the opening has a taper angle greater than a taper angle of the via hole.

In a method of producing the multilayer wiring board of a preferred embodiment of the present invention, preferably, the conductive paste includes metal powder of Sn or a Sn alloy and metal powder of a Cu—Ni or Cu—Mn alloy.

In a method of producing the multilayer wiring board of a preferred embodiment of the present invention, preferably, the conductive paste includes particles of a first metal and nanoparticles of a second metal, and the first metal and the second metal are each independently Cu or Ag.

In a method of producing the multilayer wiring board of a preferred embodiment of the present invention, preferably, the conductive paste includes Cu particles having a particle size peak in the particle size distribution of about 0.1 μm or more and about 5.0 μm or less and an average crystallite diameter of about 10 nm or more and about 100 nm or less.

Preferred embodiments of the present invention provide multilayer wiring boards each capable of preventing materials of insulating layers from flowing into the space between via conductors or between a conductive wiring layer and a via conductor.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, descriptions are provided of multilayer wiring boards, electronic devices, and methods of producing multilayer wiring boards according to preferred embodiments of the present invention with reference to the accompanying drawings.

The present invention is not limited to the following preferred embodiments, and may be suitably modified without departing from the gist of the present invention. Combinations of two or more preferred features described in the following preferred embodiments are also within the scope of the present invention.

Multilayer Wiring Board

Figure 1:
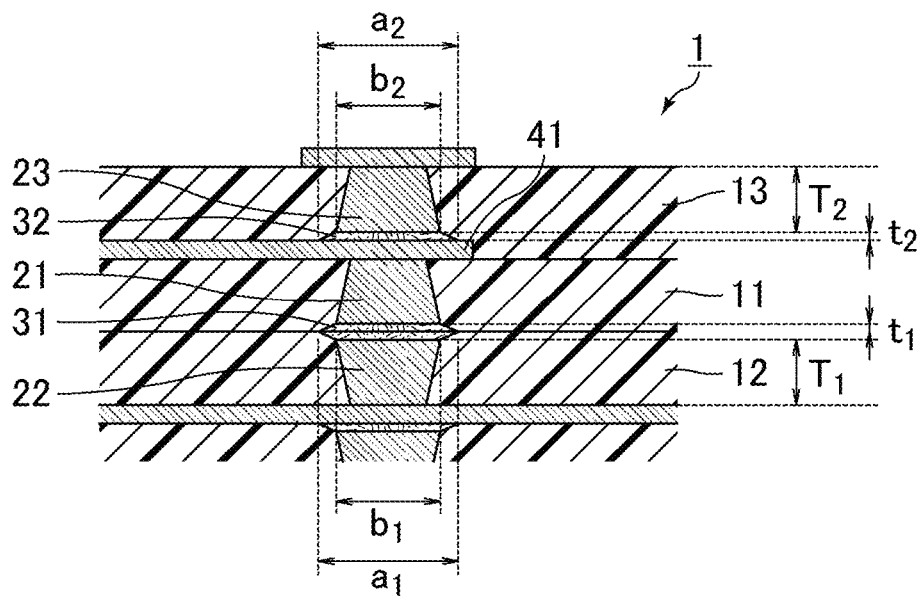
FIG. 1 is a schematic cross-sectional view of an example of a multilayer wiring board according to a preferred embodiment of the present invention.

FIG. 1 is a schematic cross-sectional view of an example of a multilayer wiring board according to a preferred embodiment of the present invention of the present invention.

Although an overall configuration is not shown in FIG. 1, a multilayer wiring board 1 at least includes a first insulating layer 11 and a second insulating layer 12 stacked on the first insulating layer 11. Via conductors 21 and 22 are disposed inside the first insulating layer 11 and the second insulating layer 12, respectively. The via conductor 21 is bonded to the via conductor 22 by a conductive bonding layer 31. In the multilayer wiring board 1 shown in FIG. 1, the first insulating layer 11 and the second insulating layer 12 each include one layer.

As shown in FIG. 1, the first insulating layer 11 is directly bonded to the second insulating layer 12, with the position of the bonding layer 31 as a boundary therebetween.

FIG. 1 shows a boundary between the first insulating layer 11 and the second insulating layer 12 for the sake of description, but such a boundary may not be clearly present.

Unlike the electric circuit board disclosed in JP H11-204943 A, the height of the multilayer wiring board can be reduced by directly bonding the first insulating layer to the second insulating layer without an adhesive layer.

In the multilayer wiring board 1 shown in FIG. 1, the relationship $a_1 > b_1$ is preferably satisfied, where $a_1$ is the maximum diameter of the bonding layer 31, and $b_1$ is the maximum diameter among the via conductors 21 and 22 at their interfaces with the bonding layer 31. In addition, the relationship $t_1 < T_1$ is preferably satisfied, where $t_1$ is the maximum thickness of the bonding layer 31, and $T_1$ is the maximum thickness among the via conductors 21 and 22.

The multilayer wiring board 1 shown in FIG. 1 further includes a third insulating layer 13 stacked on the first insulating layer 11. A conductive wiring layer 41 is disposed on a surface of the first insulating layer 11 on the side facing the third insulating layer 13, and a via conductor 23 is disposed inside the third insulating layer 13. The conductive wiring layer 41 is bonded to the via conductor 23 by a conductive bonding layer 32.

As shown in FIG. 1, the first insulating layer 11 is directly bonded to the third insulating layer 13 in a region where the conductive wiring layer 41 is not provided. A boundary between the first insulating layer 11 and the third insulating layer 13 may not be clearly present.

As described above, the height of the multilayer wiring board can be reduced by directly bonding the first insulating layer to the third insulating layer without an adhesive layer.

In the multilayer wiring board 1 shown in FIG. 1, the relationship $a_2 > b_2$ is preferably satisfied, where $a_2$ is the maximum diameter of the bonding layer 32, and $b_2$ is the maximum diameter of the via conductor 23 at its interface with the bonding layer 32. The relationship $t_2 < T_2$ is also preferably satisfied, where $t_2$ is the maximum thickness of the bonding layer 32 and $T_2$ is the maximum thickness of the via conductor 23.

In the multilayer wiring board according to the present preferred embodiment, as described above, the relationship $t_2 < T_2$ is preferably satisfied, where $a_1$ is the maximum diameter of the bonding layer, and $b_1$ is the maximum diameter of the via conductor at its interface with the bonding layer.

That the relationship $_1 > b_1$ is satisfied means that the bonding layer sticks out from the via conductor. Thus, when a bonding layer is provided such that the relationship $a_1 > b_1$ is satisfied, it is possible to prevent materials of the first insulating layer and the second insulating layer from flowing into the space between the via conductors.

As described later, the bonding layer preferably made, for example, using an intermetallic compound, in order to render the bonding layer bondable to the via conductor. The via conductor can preferably be made using a material having a metal content of about 99 wt % or more, for example. When importance is placed on bondability to the via conductor as described above, the bonding layer preferably has lower conductivity than the via conductor. Thus, the maximum diameter of the bonding layer is made larger than the maximum diameter of the via conductor, such that conductor loss in the bonding portion can be reduced.

With reference to FIG. 1, the maximum diameter $a_1$ of the bonding layer means the maximum length of the bonding layer 31 between two parallel lines in a plan view in the stacking direction, regardless of its interface with the via conductor 21 or 22. The maximum diameter $b_1$ of the via conductor means either the maximum length of the via conductor 21 between two parallel lines at its interface with the bonding layer 31 or the maximum length of the via conductor 22 between two parallel lines at its interface with the bonding layer 31 in a plan view in the stacking direction, whichever the longer.

In the multilayer wiring board according to the present preferred embodiment, the periphery of the bonding layer may not be entirely outside the via conductor, as long as at least a portion of the periphery of the bonding layer is outside the via conductor in a plan view in the stacking direction. In a plan view in the stacking direction, the periphery of the bonding layer is preferably outside the periphery of at least one via conductor, and is more preferably outside the peripheries of both via conductors.

In the multilayer wiring board according to the present preferred embodiment, preferably, the relationship $t_1<T_1$ is satisfied, where $t_1$ is the maximum thickness of the bonding layer, and $T_1$ is the maximum thickness of the via conductor.

When the maximum thickness of the bonding layer is made smaller than the maximum thickness of the via conductor, conductor loss in an interlayer connection direction can be reduced.

As shown in FIG. 1, the maximum thickness $t_1$ of the bonding layer means the maximum length of the bonding layer 31 between two parallel lines. As shown in FIG. 1, the maximum thickness $T_1$ of the via conductor means either the maximum length of the via conductor 21 between two parallel lines or the maximum length of the via conductor 22 between two parallel lines, whichever the longer.

In the multilayer wiring board according to another preferred embodiment of the present invention, as described above, the relationship $a_2>b_2$ is preferably satisfied, where $a_2$ is the maximum diameter of the bonding layer, and $b_2$ is the maximum diameter of the via conductor at its interface with the bonding layer.

That the relationship $a_2>b_2$ is satisfied means that the bonding layer sticks out from the via conductor. Thus, when a bonding layer is provided such that the relationship $a_2>b_2$ is satisfied, it is possible to prevent materials of the first insulating layer and the third insulating layer from flowing into the space between the conductive wiring layer and the via conductor.

The bonding layer tends to have lower conductivity than the via conductor and the conductive wiring layer. Thus, the maximum diameter of the bonding layer is made larger than the maximum diameter of the via conductor, such that conductor loss in the bonding portion can be reduced.

With reference to FIG. 1, the maximum diameter $a_2$ of the bonding layer means the maximum length of the bonding layer 32 between two parallel lines in a plan view in the stacking direction, regardless of its interface with the via conductor 23. The maximum diameter $b_2$ of the via conductor means the maximum length of the via conductor 23 between two parallel lines at its interface with the bonding layer 32 in a plan view in the stacking direction.

In the multilayer wiring board according to the present preferred embodiment, the periphery of the bonding layer may not be entirely outside the via conductor, as long as at least a portion of the periphery of the bonding layer is outside the via conductor in a plan view in the stacking direction.

In the multilayer wiring board according to the present preferred embodiment, the relationship $t_2<T_2$ is preferably satisfied, where $t_2$ is the maximum thickness of the bonding layer, and $T_2$ is the maximum thickness of the via conductor.

When the maximum thickness of the bonding layer is made smaller than the maximum thickness of the via conductor, conductor loss in an interlayer connection direction can be reduced.

As shown in FIG. 1, the maximum thickness $t_2$ of the bonding layer means the maximum length of the bonding layer 32 between two parallel lines. As shown in FIG. 1, the maximum thickness $T_2$ of the via conductor means the maximum length of the via conductor 23 between two parallel lines.

Figure 2:
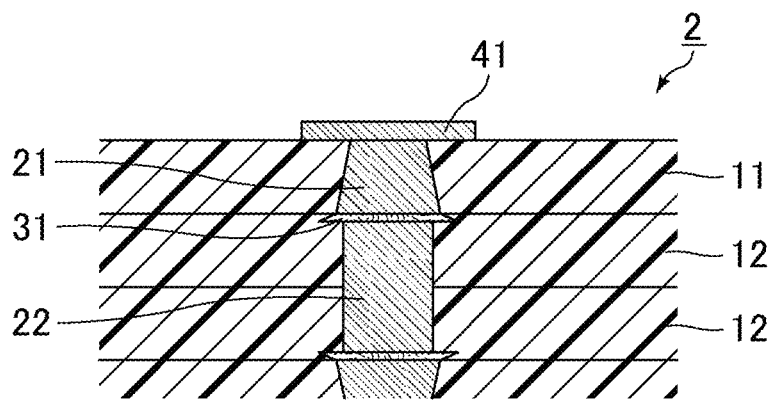
FIG. 2 is a schematic cross-sectional view of another example of a multilayer wiring board according to a preferred embodiment of the present invention.

FIG. 2 is a schematic cross-sectional view of another example of a multilayer wiring board according to a preferred embodiment of the present invention.

Although an overall configuration is not shown in FIG. 2, a multilayer wiring board 2 at least includes the first insulating layer 11 and the second insulating layer 12 stacked on the first insulating layer 11. The via conductors 21 and 22 are disposed inside the first insulating layer 11 and the second insulating layer 12, respectively. The via conductor 21 is bonded to the via conductor 22 by the conductive bonding layer 31. In the multilayer wiring board 2 shown in FIG. 2, preferably, the first insulating layer 11 includes one layer, and the second insulating layer 12 includes two layers.

Figure 3:
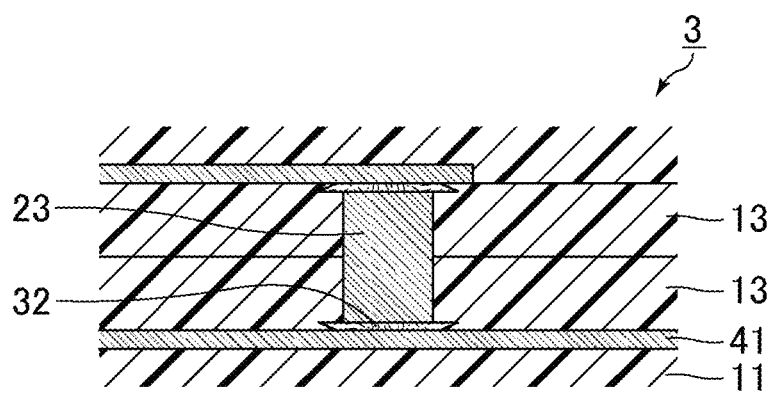
FIG. 3 is a schematic cross-sectional view of another example of a multilayer wiring board according to a preferred embodiment of the present invention.

FIG. 3 is a schematic cross-sectional view of another example of a multilayer wiring board according to a preferred embodiment of the present invention.

Although an overall configuration is not shown in FIG. 3, a multilayer wiring board 3 at least includes the first insulating layer 11 and the third insulating layer 13 stacked on the first insulating layer 11. The conductive wiring layer 41 is disposed on the surface of the first insulating layer 11 on the side facing the third insulating layer 13, and the via conductor is disposed inside the third insulating layer 13. The conductive wiring layer 41 is bonded to the via conductor 23 by a conductive bonding layer 32. In the multilayer wiring board 3 shown in FIG. 3, the third insulating layer 13 preferably includes two layers.

Figure 4:
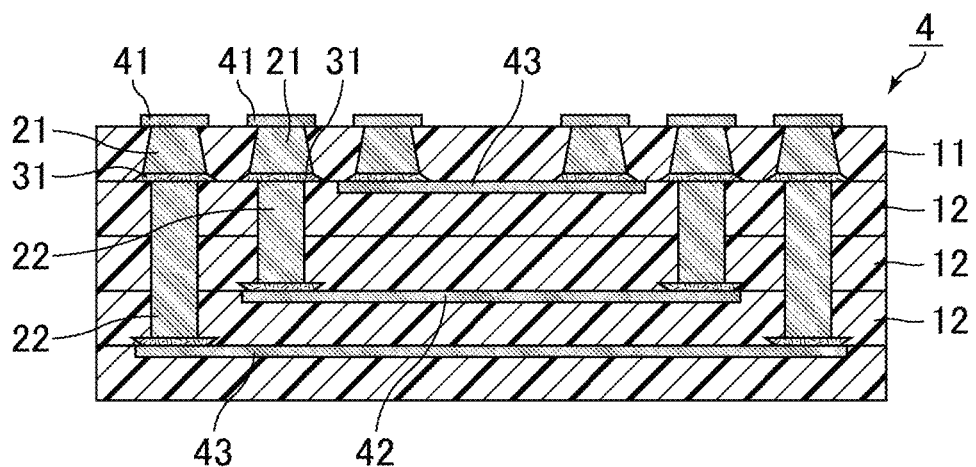
FIG. 4 is a schematic cross-sectional view of a specific example of a multilayer wiring board according to a preferred embodiment of the present invention.

FIG. 4 is a schematic cross-sectional view of a specific example of a multilayer wiring board according to a preferred embodiment of the present invention.

A multilayer wiring board 4 shown in FIG. 4 at least includes the first insulating layer 11 and the second insulating layer 12. In the multilayer wiring board 4 shown in FIG. 4, a signal line 42 is provided on a surface of the insulating layer in the middle of three second insulating layers 12, and a ground conductor 43 is provided on each of the insulating layers above and below the insulating layer in the middle, such that a circuit in which the signal line 42 is sandwiched between two ground conductors 43 is provided.

In the multilayer wiring board 4 shown in FIG. 4, penetration of the interlayer connection conductors through two or more insulating layers is required for the signal line 42 and the ground conductor 43 below the signal line 42 to be conductive to the respective conductive wiring layers 41 provided on the outermost surface of the board. In this case, conductor loss in the interlayer connection direction can be reduced more when a metal pin or the like is used to penetrate one interlayer connection conductor through multiple insulating layers than when a via conductor is disposed in each second insulating layer 12 and these via conductors are bonded by the bonding layers.

Insulation Layer

The insulating layers such as the first insulating layer, second insulating layer, and third insulating layer are preferably made of, for example, electrically insulating, plate-shaped or film-shaped resin sheets. The resin to form the resin sheets may be a thermoplastic resin or a thermosetting resin, but a thermoplastic resin is preferred. Use of a thermoplastic resin sheet enables bonding of the insulating layers together without an adhesive layer.

Examples of the thermoplastic resin include liquid crystal polymers (LCP), thermoplastic polyimide resins, polyether ether ketone (PEEK) resins, and polyphenylene sulfide (PPS) resins. Of these, liquid crystal polymers (LCP) are preferred. Liquid crystal polymers have a lower water absorption rate than other thermoplastic resins. Thus, a multilayer wiring board including an insulating layer made of a liquid crystal polymer is unlikely to undergo changes in electrical characteristics associated with water intrusion.

Each of the insulating layers such of the first insulating layer, second insulating layer, and third insulating layer may include one layer or two or more layers. In other words, the via conductor may be disposed to penetrate through one insulating layer or two or more insulating layers in the thickness direction.

Conductive Wiring Layer

The conductive wiring layer is disposed parallel or substantially parallel to a main surface direction of the insulating layer.

The conductive wiring layer may be a conductive wiring layer used for a known wiring board. Examples of materials of the conductive wiring layer include copper (Cu), silver (Ag), aluminum (Al), stainless steel (SUS), nickel (Ni), gold (Au), and alloys thereof. Of these, copper (Cu) is particularly preferred. The conductive wiring layer is preferably made of conductive foil, particularly preferably copper foil.

Via Conductor

The via conductor penetrates through at least one insulating layer in the thickness direction.

The via conductor may be a plated via conductor made of plated metal or a paste via conductor made of a sintered conductive paste. Such a via conductor is formed by, for example, filling a via hole in the insulating layer with plated metal or a conductive paste. The via conductor may be a metal pin. The shape of a metal pin may preferably be cylindrical, for example. In order to reduce resistance, preferably, the via conductor is made of plated metal or is a metal pin. When a via conductor penetrates through two or more insulating layers, the via conductor is preferably a metal pin because it takes time to form a via conductor made of plated metal.

For example, when the first insulating layer and the second insulating layer each include one layer, preferably, the via conductor inside the first insulating layer and the via conductor inside the second insulating layer are each made of plated metal. When one of the first insulating layer or the second insulating layer includes one layer, and the other insulating layer includes two or more layers, preferably, the via conductor in the insulating layer including one layer is made of plated metal, and the via conductor inside the insulating layer including two or more layers is a metal pin.

When the third insulating layer includes one layer, the via conductor inside the third insulating layer is preferably made of plated metal. When the third insulating layer includes two or more layers, the via conductor inside the third insulating layer is preferably a metal pin.

The metal content of the via conductor is not limited. Yet, in order to reduce resistance, the metal content is preferably about 99 wt % or more, more preferably about 99.5 wt % or more, particularly preferably about 100 wt %. In other words, the via conductor is particularly preferably made of only metal.

Examples of materials of the via conductor include copper (Cu), tin (Sn), silver (Ag), and solder. When the via conductor is made of plated metal, the via conductor may include multiple plated layers, such as copper and tin layers or copper and silver layers.

Bonding Layer

The bonding layer is preferably made of a conductive paste described in each preferred embodiment, as described later.

In the multilayer wiring boards according to preferred embodiments of the present invention, the overall size of the multilayer wiring board is not limited. However, the multilayer wiring board may have an overall thickness greater than the overall width thereof.

Electronic Device

The multilayer wiring boards according to preferred embodiments of the present invention are preferably used as interposers, for example.

In particular, a preferred embodiment of the present invention provides an electronic device including a first circuit board, a second circuit board, and an interposer between the first circuit board and the second circuit board, the interposer including multiple terminals, wherein the interposer is a multilayer wiring board according to a preferred embodiment of the present invention, and the first circuit board and the second circuit board are electrically connected to the via conductors in the multilayer wiring board.

Figure 5:
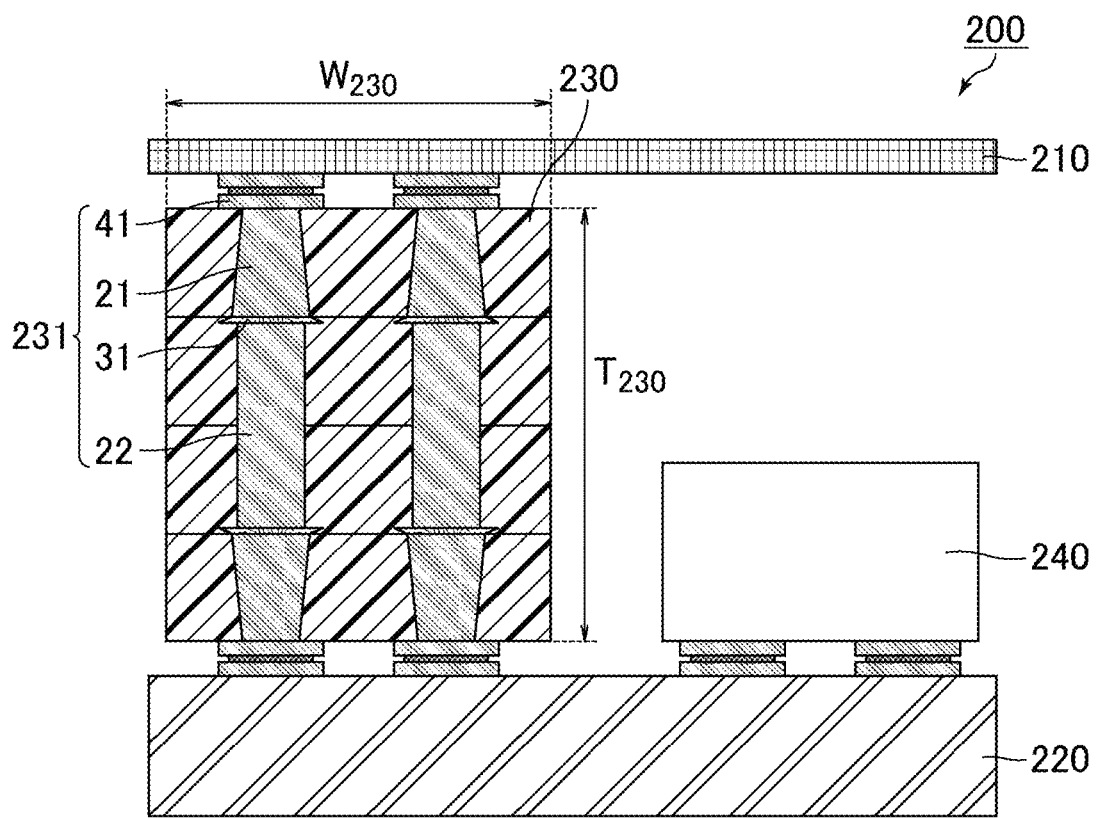
FIG. 5 is a schematic cross-sectional view of an example of an electronic device according to a preferred embodiment of the present invention.

FIG. 5 is a schematic cross-sectional view of an example of the electronic device of the present invention.

An electronic device 200 shown in FIG. 5 includes a first circuit board 210, a second circuit board 220, and an interposer 230 between the first circuit board 210 and the second circuit board 220, the interposer 230 including multiple terminals 231. An electronic component 240 is mounted on a surface of the second circuit board 220, and the interposer 230 is disposed to avoid contact with the electronic component 240.

The electronic device 200 shown in FIG. 5 includes, as the interposer 230, a multilayer wiring board having the same or similar configuration as that of the multilayer wiring board 2 shown in FIG. 2. Each terminal 231 includes the via conductor 21, the via conductor 22, the bonding layer 31, the conductive wiring layer 41, and the like.

In the electronic device 200 shown in FIG. 5, a relationship $T_{230} > W_{230}$ is preferably satisfied, where $T_{230}$ is the overall thickness of the interposer 230, and $W_{230}$ is the overall width of the interposer 230.

The first circuit board 210 and the second circuit board 220 are electrically connected to the via conductors 21 and 22 of the multilayer wiring board.

In the electronic device according to the present preferred embodiment, the interposer is a multilayer wiring board according to a preferred embodiment of the present invention, so that resistance in the interlayer connection direction can be reduced. In particular, even when the multilayer wiring board has an overall thickness greater than the overall width thereof as shown in FIG. 5, the multilayer wiring board of the present preferred embodiment is advantageous because it has an advantageous effect of significantly reducing resistance in the interlayer connection direction. Such a high density arrangement is preferably used in devices such as smartphones.

In the electronic device of the present preferred embodiment, preferably, the interposer allows high frequency signals to pass therethrough.

When the interposer allows high frequency signals to pass therethrough, use of the multilayer wiring board according to a preferred embodiment of the present invention which can reduce conductor loss can particularly reduce transmission loss.

In the electronic device of the present preferred embodiment, the first circuit board and the second circuit board are not particularly limited. For example, the first circuit board may preferably be an antenna, and the second circuit board may preferably be a control board on which a high frequency integrated circuit (RFIC) is mounted.

Method of Producing the Multilayer Wiring Board

The following describes a non-limiting example of a method of producing the multilayer wiring board according to a preferred embodiment of the present invention.

The method of producing the multilayer wiring board includes, for example, preparing an insulating sheet including a via hole penetrating from one of its surfaces to the other, forming a via conductor in the via hole in the insulating sheet, and stacking multiple insulating sheets that include the insulating sheet including the via conductor, and collectively compressing these insulating sheets by heat treatment, wherein the via conductor is bonded to a via conductor or a conductive wiring layer formed on another insulating sheet by a conductive paste layer formed from a conductive paste, and the conductive paste layer has a maximum diameter greater than the maximum diameter of the via conductor exposed to the surface of the insulating sheet.

FIGS. 6A to 6G are each a schematic cross-sectional view of a non-limiting example of a method of producing the multilayer wiring board shown in FIG. 1.

Preparing Insulating Sheet

Figure 6A:
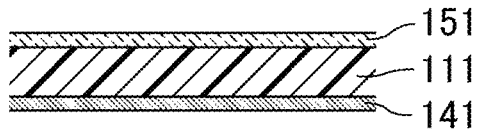
FIGS. 6A to 6G are each a schematic cross-sectional view of an example of a method of producing the multilayer wiring board shown in FIG. 1.

As shown in FIG. 6A, an insulating sheet 111 with conductive foil 141 attached to one of its surfaces and a protection film 151 attached to the other surface is prepared. The insulating sheet turns into an insulating layer, such as the first insulating layer.

For example, a known single-sided copper clad laminate is provided in which 12 μm-thick copper foil is attached to one surface of a 50 μm-thick insulating sheet, and a 25 μm-thick polyethylene terephthalate (PET) film is attached to the insulating sheet side of the single-sided copper clad laminate.

The insulating sheet may preferably be, for example, an insulating resin sheet containing a resin such as the above-described thermoplastic resin. The thickness of the insulating sheet is, for example, about 13 μm, about 18 μm, about 25 μm, about 50 μm, about 100 μm, about 250 μm, about 500 μm, about 1000 μm, or about 2000 μm.

Examples of materials of the conductive foil include copper, silver, aluminum, stainless steel, nickel, gold, and alloys thereof. The conductive foil is preferably copper foil. The thickness of the conductive foil is, for example, about 6 μm, about 12 μm, about 18 μm, about 25 μm, or about 35 μm.

Examples of materials of the protection film include polyethylene terephthalate (PET) and polyethylene naphthalate (PEN). The thickness of the protection film is, for example, about 12 μm, about 16 μm, or about 25 μm.

Forming Opening and Via Hole

Figure 6B:
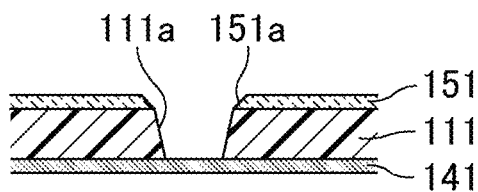

As shown in FIG. 6B, from the protection film 151 side, an opening 151a is formed which penetrates through the protection film 151, and a via hole 111a is also formed which penetrates through the insulating sheet 111 to the conductive foil 141.

For example, a predetermined position on the PET film is irradiated with laser, such that an opening that penetrates through the PET film is formed, and a via hole that penetrates through the insulating sheet to the backside of the copper foil (the upper side in FIG. 6B) is also formed. Laser processing is performed using, for example, a pulse oscillation-type carbon dioxide laser processor, and the diameter of the via hole is set to about 100 μm. Preferably, a desmear treatment is subsequently performed by, for example, oxygen plasma discharge treatment or corona discharge treatment, in order to remove resin residue inside the via hole. Alternatively, the resin residue may be removed by potassium permanganate treatment or the like.

As shown in FIG. 6B, preferably, the opening 151a in the protection film 151 and the via hole 111a in the insulating sheet 111 each have a tapered shape whose diameter decreases toward the conductive foil 141.

When the opening in the protection film and the via hole in the insulating sheet each have the tapered shape, it is possible to make the maximum diameter of the bonding layer greater than the maximum diameter of the via conductor when forming the bonding layer through the opening of the protection film.

The protection film, such as a PET film, for example, has a melting point that is significantly lower than the melting point of the insulating sheet. Thus, the protection film is melted by laser irradiation, and as shown in FIG. 6B, the opening 151a in the protection film 151 has a taper angle greater than the taper angle of the via hole 111a in the insulating sheet 111.

As described above, preferably, the opening in the protection film has a taper angle greater than the taper angle of the via hole in the insulating sheet. When the opening in the protection film has a taper angle greater than the taper angle of the via hole in the insulating sheet, it is possible to make the maximum diameter of the bonding layer even greater than the maximum diameter of the via conductor when forming the bonding layer through the opening of the protection film.

Forming Via Conductor

Figure 6C:
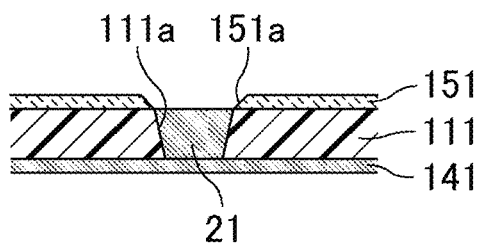

As shown in FIG. 6C, the via conductor 21 is formed in the via hole 111a in the insulating sheet 111.

For example, a plated via conductor is formed in the via hole by electroplating using copper foil as one electrode. Any metal may be used for the via conductor as long as the metal can be plated, but copper (Cu) is most preferred.

The filling amount of the via conductor is not limited. For example, the top surface of the via conductor may be slightly lower than the surface of the insulating sheet.

Figure 6D:
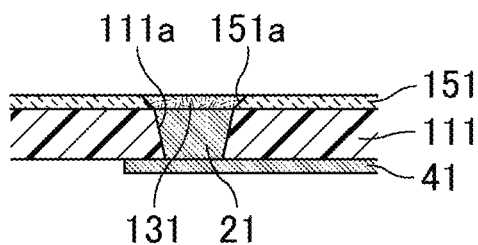

After forming the via conductor, the copper foil is etched by a known etching technique, such that the conductive wiring layer is formed. The conductive wiring layer may be formed at any timing. In FIG. 6D and subsequent figures, the conductive wiring layer 41 is present.

Forming a Conductive Paste Layer

Figure 6E:
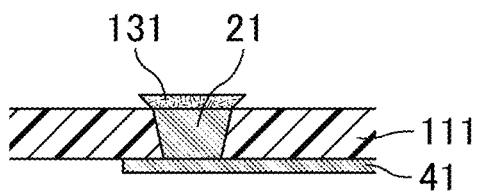

As shown in FIGS. 6D and 6E, a conductive paste layer 131 is formed which has a maximum diameter greater than the maximum diameter of the via conductor 21 exposed to a surface of the insulating sheet by applying a conductive paste to the via conductor 21.

For example, the opening in the PET film is filled with a conductive paste such that the plated via conductor in the via hole is covered with the conductive paste. In this case, for example, the conductive paste is applied as if printed with the PET film as a mask. Thus, the conductive paste is applied to be flush with the PET film, and a through conductor integrated with the plated via conductor is formed. When the PET film is removed after drying the conductive paste, the through conductor slightly projects (e.g., about 25 μm) from insulating sheet on the side opposite to the copper foil.

As described, in the forming a conductive paste layer, preferably, the opening in the protection film is filled with a conductive paste to form a conductive paste layer, and the protection film is subsequently removed.

In particular, when the opening in the protection film and the via hole in the insulating sheet each have the tapered shape, it is possible to make the maximum diameter of the conductive paste layer greater than the maximum diameter of the via conductor exposed to the surface of the insulating sheet.

The conductive paste may be applied by a printing method using a dispenser, such as inkjet printing or aerosoljet printing, for example, after removing the protection film.

Stacking and Collectively Compressing Insulating Sheets

Figure 6F:
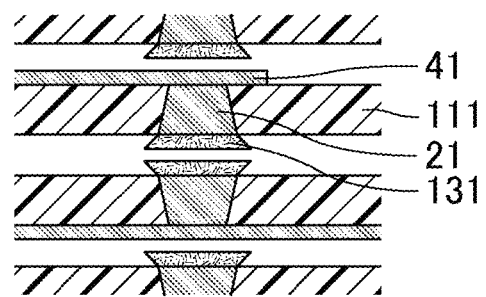
Figure 6G:
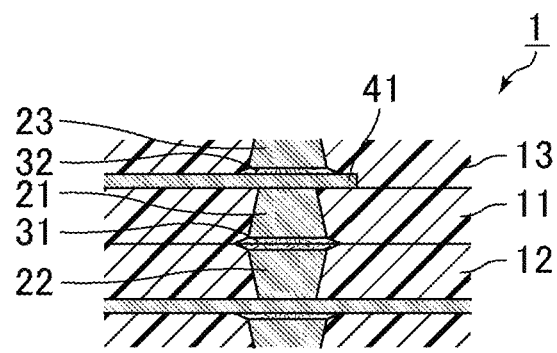

Multiple insulating sheets each including the via conductor and the conductive paste layer formed as described above are stacked and collectively compressed by heat treatment. In FIG. 6F, four insulating sheets are stacked together which include the insulating sheet 111 including the via conductor 21 and the conductive paste layer 131. After stacking, the insulating sheets are compressed by heat treatment, such that the insulating sheets turn into insulating layers, and the conductive paste layer turns into a bonding layer. As a result, as shown in FIG. 6G, the multilayer wiring board 1 shown in FIG. 1 is obtained.

Figure 7A:
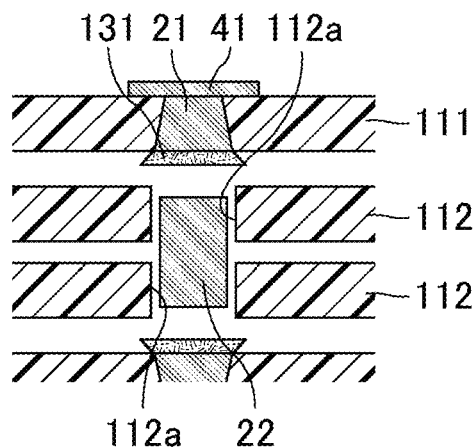
FIGS. 7A and 7B are each a schematic cross-sectional view of an example of a method of producing the multilayer wiring board shown in FIG. 2.
Figure 7B:
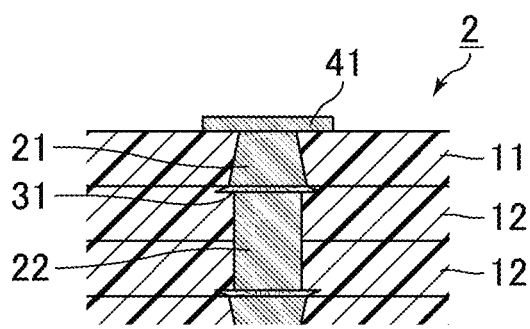

FIGS. 7A and 7B are each a schematic cross-sectional view of a non-limiting example of a method of producing the multilayer wiring board shown in FIG. 2.

In FIG. 7A, a metal pin is inserted through via holes 112a in two insulating sheets 112, such that the via conductor 22 is formed. Then, multiple insulating sheets are stacked together which include the insulating sheet 111 including the conductive wiring layer 41, the via conductor 21, and the conductive paste layer 131, and the insulating sheets 112 including the via conductor 22.

After stacking, the insulating sheets are collectively compressed by heat treatment, such that the insulating sheets turn into insulating layers, and the conductive paste layer turns into a bonding layer. Here, when a thermoplastic resin is used as a material of the insulating sheet, the gap between the via hole 112a and the metal pin (the via conductor 22) is filled with a fluid resin during heating and pressing, which enables fixation of the metal pin. Further, the metal pin (the via conductor 22) and the via conductor 21 are conductively connected together by a bonding material formed from the conductive paste. As a result, as shown in FIG. 7B, the multilayer wiring board 2 shown in FIG. 2 is obtained.

Figure 8:
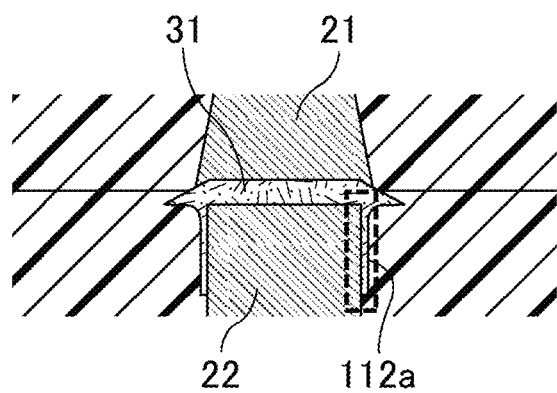
FIG. 8 is a schematic enlarged view of an example of a bonding portion between a metal pin and a bonding layer.

FIG. 8 is a schematic enlarged view of an example of a bonding portion between a metal pin and a bonding layer.

As shown in a portion surrounded by dotted lines in FIG. 8, a bonding material that turns into the bonding layer 31 may extend onto a portion of the via hole 112a. In this manner, the lateral side of the metal pin (the via conductor 22) can also define and function as a bonding surface, so that the bonding strength between the metal pin (the via conductor 22) and the bonding layer 31 can be further increased.

Figure 9A:
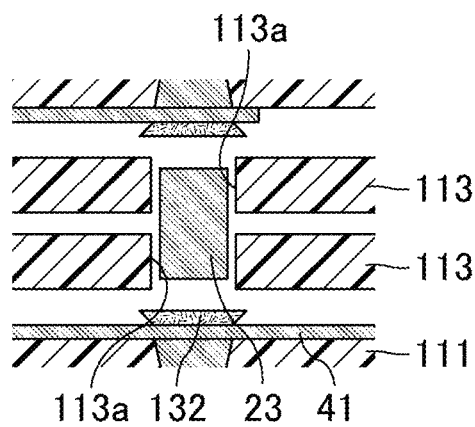
FIGS. 9A and 9B are each a schematic cross-sectional view of an example of a method of producing the multilayer wiring board shown in FIG. 3.
Figure 9B:
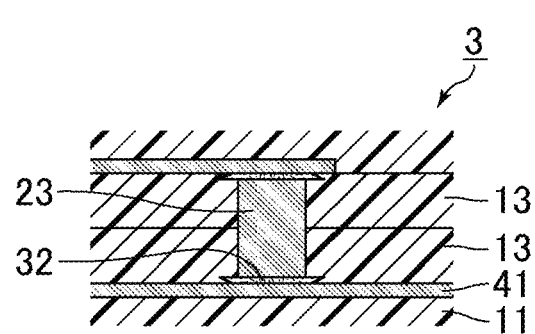

FIGS. 9A and 9B are each a schematic cross-sectional view of a non-limiting example of a method of producing the multilayer wiring board shown in FIG. 3.

In FIG. 9A, a metal pin is inserted through via holes 113a in two insulating sheets 113, such that the via conductor 23 is formed. Then, multiple insulating sheets are stacked together which include the insulating sheet 111 including the conductive wiring layer 41 and a conductive paste layer 132, and the insulating sheets 113 including the via conductor 23.

After stacking, the insulating sheets are collectively compressed by heat treatment, such that the insulating sheets turn into insulating layers, and the conductive paste layer turns into a bonding layer. As a result, as shown in FIG. 9B, the multilayer wiring board 3 shown in FIG. 3 is obtained.

Figure 10:
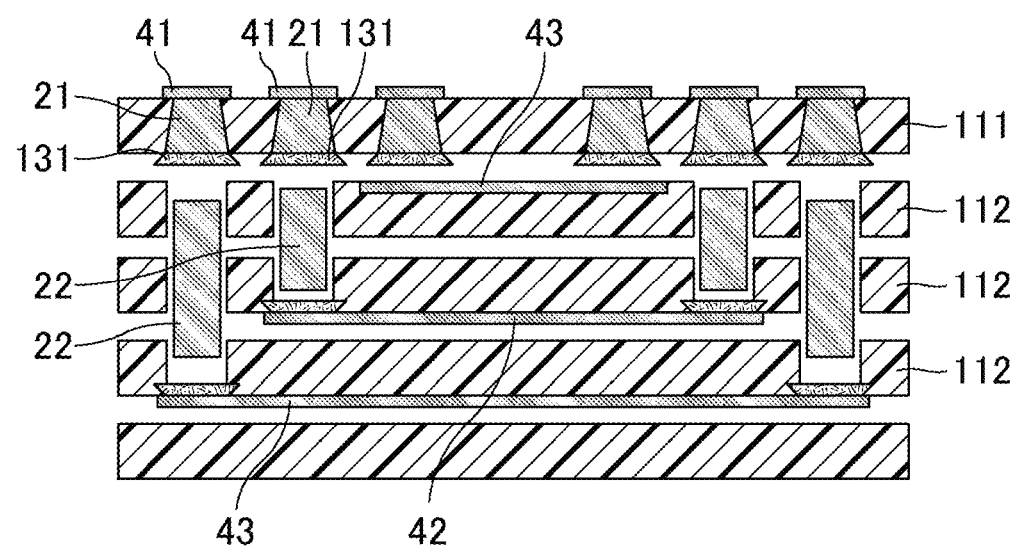
FIG. 10 is a schematic cross-sectional view of a method of producing the multilayer wiring board shown in FIG. 4.

FIG. 10 is a schematic cross-sectional view of a method of producing the multilayer wiring board shown in FIG. 4.

In FIG. 10, metal pins penetrating through the multiple insulating sheets 112 define the via conductors 22. Then, multiple insulating sheets are stacked together which include the insulating sheet 111 including the conductive wiring layer 41, the via conductor 21, and the conductive paste layer 131, the insulating sheets 112 each including the signal line 42, and the insulating sheet 112 including the ground conductor 43.

After stacking, the insulating sheets are collectively compressed by heat treatment, such that the multilayer wiring board 4 shown in FIG. 4 is obtained.

When the method of producing the multilayer wiring board of a preferred embodiment of the present invention requires formation of a metal pin penetrating through multiple insulating layers as a via conductor, fixing a metal pin and bonding the metal pin with another via conductor may be performed separately, instead of collectively pressing as described above. For example, the method may include fixing a metal pin as the via conductor 22 in the insulating sheet 112, and subsequently, stacking and compressing the insulating sheet 112 on the insulating sheet 111 including the via conductor 21 and the conductive paste layer 131 so as to connect the via conductor 21 to the metal pin (the via conductor 22) by a bonding material.

When the insulating sheet is made of a thermoplastic resin and the via conductor is a metal pin, collective compression of the stack by heat treatment causes inflow of the thermoplastic resin around the metal pin, resulting in fixation of the metal pin. Here, when the maximum diameter of the conductive paste layer that turns into a bonding layer is greater than the maximum diameter of the via conductor, it is possible to prevent the metal pin from being positionally shifted by the inflow of the resin. As a result, bonding defects due to a positional shift of the metal pin can be prevented.

The following describes a preferred embodiment of a conductive paste used to form the bonding layer.

The following preferred embodiments are examples, and features of different preferred embodiments can be partially exchanged or combined with each other. In the second preferred embodiment and subsequent preferred embodiments, description of features common to the first preferred embodiment is omitted, and only different points are described. In particular, similar advantageous effects by similar features are not mentioned in each preferred embodiment.

First Preferred Embodiment

In the first preferred embodiment of the present invention, the conductive paste used to form the bonding layer preferably includes metal powder of Sn or a Sn alloy and metal powder of a Cu—Ni or Cu—Mn alloy, for example.

Figure 11A:
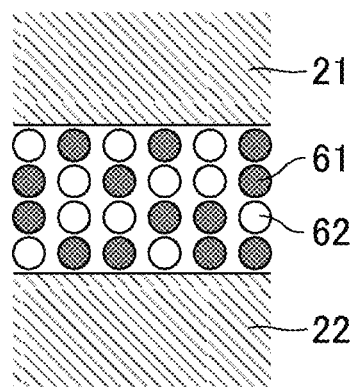
FIGS. 11A to 11C are each a schematic view of how a bonding layer is formed using a conductive paste according to a first preferred embodiment of the present invention.
Figure 11B:
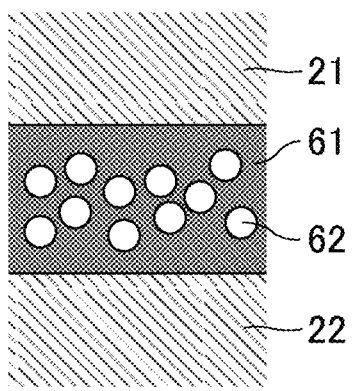
Figure 11C:
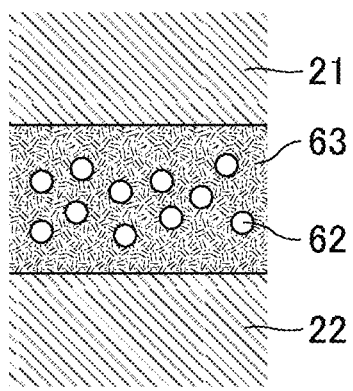

FIGS. 11A to 11C are each a schematic view of how a bonding layer is formed using a conductive paste according to the first preferred embodiment of the present invention.

FIG. 11A shows a state before heating. A conductive paste including metal powder of Sn or Sn alloy 61 and metal powder of a Cu—Ni or Cu—Mn alloy 62 is present between the via conductor 21 and the via conductor 22. When heating is performed in this state and the temperature of the conductive paste reaches the melting point or higher of the Sn or Sn alloy 61, the Sn or Sn alloy 61 melts as shown in FIG. 11B. Further heating causes a reaction between the Sn or Sn alloy 61 and the Cu—Ni or Cu—Mn alloy 62 to produce an intermetallic compound 63 (e.g., $(Cu, Ni)_6Sn_5$, $(Cu, Mn)_6Sn_5$, $(Cu, Ni)_3Sn$, or $(Cu, Mn)_3Sn$) as shown in FIG.

11C. A reaction between the Sn or Sn alloy 61 and Cu or the like defining the via conductor 21 or 22 also produces the intermetallic compound 63 (e.g., $Cu_6Sn_5$ or $Cu_3Sn$).

A similar reaction as described above occurs to produce an intermetallic compound also when a conductive paste including metal powder of Sn or a Sn alloy and metal powder of a Cu—Ni or Cu—Mn alloy is disposed between the conductive wiring layer and the via conductor.

As described above, in the first preferred embodiment of the present invention, bonding is achieved between the via conductors or between the conductive wiring layer and the via conductor by the bonding layer including an intermetallic compound.

The conductive paste according to the first preferred embodiment of the present invention may preferably be, for example, a conductive paste disclosed in JP 5146627 B.

Examples of the Sn or Sn alloy included in the conductive paste include a simple substance of Sn and alloys containing Sn and at least one selected from the group consisting of Cu, Ni, Ag, Au, Sb, Zn, Bi, In, Ge, Al, Co, Mn, Fe, Cr, Mg, Mn, Pd, Si, Sr, Te, and P. The Sn content of the Sn alloy is preferably about 70 wt % or more, more preferably about 85 wt % or more, for example.

The proportion of Ni in the Cu—Ni alloy included in the conductive paste is preferably about 10 wt % or more and about 15 wt % or less, for example. The proportion of Mn in the Cu—Mn alloy is preferably about 10 wt % or more and about 15 wt % or less, for example. This enables supply of a necessary and sufficient amount of Ni or Mn to produce a desired intermetallic compound. When the proportion of Ni in the Cu—Ni alloy or the proportion of Mn in the Cu—Mn alloy is less than about 10 wt %, a portion of Sn tends to remain unreacted without being converted into an intermetallic compound. Also when the proportion of Ni in the Cu—Ni alloy or the proportion of Mn in the Cu—Mn alloy is more than about 15 wt %, a portion of Sn tends to remain unreacted without being converted into an intermetallic compound.

The Cu—Ni or Cu—Mn alloy may include both Mn and Ni or may include a third component such as P.

The metal powder of Sn or a Sn alloy and the metal powder of a Cu—Ni alloy or a Cu—Mn alloy each preferably have an arithmetic mean particle size of about 3 µm or more and about 10 µm or less, for example. When the mean particle size of each metal powder is too small, it increases the production cost. In addition, such metal powder tends to be oxidized quickly and interferes with a reaction. In contrast, when the mean particle size of each metal powder is too large, it is difficult to fill the via hole with the conductive paste.

The proportion of the Cu—Ni or Cu—Mn alloy in a metal component of the conductive paste is preferably about 30 wt % or more, for example. In other words, the proportion of the Sn or Sn alloy in the metal component of the conductive paste is preferably about 70 wt % or less, for example. In this case, the proportion of residual Sn is decreased, allowing for an increase in the proportion of the intermetallic compound.

The proportion of the metal component in the conductive paste is preferably about 85 wt % or more and about 95 wt % or less, for example. When the proportion of the metal component is more than about 95 wt %, it is difficult to obtain a low-viscosity conductive paste having excellent filling properties. In contrast, when the proportion of the metal component is less than about 85 wt %, a flux component tends to remain.

The conductive paste preferably includes a flux component. Examples of the flux component include various known flux components as materials of conductive pastes, and the flux component contains a resin. Examples of components other than the resin include vehicles, solvents, thixotropic agents, and activators.

The resin preferably includes at least one thermosetting resin selected from the group consisting of epoxy resins, phenolic resins, polyimide resins, silicone resins or modified resins thereof, and acrylic resins, or at least one thermoplastic resin selected from the group consisting of polyamide resins, polystyrene resins, polymethacrylic resins, polycarbonate resins, and cellulose-based resins.

Examples of the vehicles include rosin-based resins and synthetic resins, which are obtained from rosin and rosin derivatives such as modified rosins or the like, and mixtures thereof. Examples of the rosin-based resins obtained from rosin and rosin derivatives such as modified rosins include gum rosin, tall rosin, wood rosin, polymerized rosin, hydrogenated rosin, formylated rosin, rosin ester, rosin-modified maleic acid resin, rosin-modified phenolic resin, rosin-modified alkyd resin, and other various rosin derivatives. Examples of the synthetic resins obtained from rosin and rosin derivatives such as modified rosins include polyester resins, polyamide resins, phenoxy resins, and terpene resins.

Examples of the solvents include alcohols, ketones, esters, ethers, aromatics, and hydrocarbons. Specific examples include benzyl alcohol, ethanol, isopropyl alcohol, butanol, diethylene glycol, ethylene glycol, glycerol, ethyl cellosolve, butyl cellosolve, ethyl acetate, butyl acetate, butyl benzoate, diethyl adipate, dodecane, tetradecene, α-terpineol, terpineol, 2-methyl-2,4-pentanediol, 2-ethylhexanediol, toluene, xylene, propylene glycol monophenyl ether, diethylene glycol monohexyl ether, ethylene glycol monobutyl ether, diethylene glycol monobutyl ether, diisobutyl adipate, hexylene glycol, cyclohexane dimethanol, 2-terpinyloxy ethanol, 2-dihydroterpinyloxy ethanol, and mixtures thereof. Preferred among these are terpineol, ethylene glycol monobutyl ether, diethylene glycol monoethyl ether, and diethylene glycol monobutyl ether.

Specific examples of the thixotropic agents include hydrogenated castor oil, carnauba wax, amides, hydroxy fatty acids, dibenzylidene sorbitol, bis(p-methylbenzylidene)sorbitol, beeswax, stearamide, and ethylenebisamide hydroxystearate. The thixotropic agents can also be these thixotropic agents to which the following additives are added as needed: fatty acids such as caprylic acid, lauric acid, myristic acid, palmitic acid, stearic acid, and behenic acid; hydroxy fatty acids such as 1,2-hydroxystearic acid; antioxidants; surfactants; and amines.

Examples of the activators include amine hydrohalides, organohalogen compounds, organic acids, organic amines, and polyhydric alcohols.

Examples of the amine hydrohalides include diphenylguanidine hydrobromide, diphenylguanidine hydrochloride, cyclohexylamine hydrobromide, ethylamine hydrochloride, ethylamine hydrobromide, diethylaniline hydrobromide, diethylaniline hydrochloride, triethanolamine hydrobromide, and monoethanolamine hydrobromide.

Examples of the organohalogen compounds include chlorinated paraffins, tetrabromoethane, dibromopropanol, 2,3-dibromo-1,4-butanediol, 2,3-dibromo-2-butene-1,4-diol, and tris(2,3-dibromopropyl)isocyanurate.

Examples of the organic acid include malonic acid, fumaric acid, glycolic acid, citric acid, malic acid, succinic acid, phenyl succinic acid, maleic acid, salicylic acid, anthranilic acid, glutaric acid, suberic acid, adipic acid, sebacic acid, stearic acid, abietic acid, benzoic acid, trimellitic acid, pyromellitic acid, and dodecanoic acid.

Examples of the organic amine include monoethanolamine, diethanolamine, triethanolamine, tributylamine, aniline, and diethylaniline.

Examples of the polyhydric alcohol include erythritol, pyrogallol, and ribitol.

In the multilayer wiring board according to the first preferred embodiment of the present invention, the via conductor is preferably made of copper, particularly preferably plated copper, for example. The conductive wiring layer is preferably made of copper, particularly preferably copper foil, for example.

In the method of producing the multilayer wiring board according to the first preferred embodiment of the present invention, in the collectively compressing multiple insulating sheets, preferably, the heat treatment temperature reaches, for example, about 230° C. or higher for at least a certain period of time. When the heat treatment temperature does not reach about 230° C., Sn (melting point: 232° C.) does not melt, failing to produce an intermetallic compound. The highest heat treatment temperature is preferably about 350° C. or lower, for example. When the highest heat treatment temperature is higher than about 350° C., it may cause outflow of resin such as a liquid crystal polymer (LCP) defining the insulating sheet.

Example 1

Sn powder having an average particle size of about 5 μm and Cu-10 Ni alloy powder (weight ratio of Cu/Ni is about 90/10) having an average particle size of about 5 μm were mixed at a weight ratio of about 60:40 to obtain a metal component. To the metal component was added a flux component including rosin (a vehicle) and terpineol (a solvent) at a weight ratio of about 90:10 (metal component: flux component), and these components were kneaded together, such that a conductive paste was prepared.

A copper-clad sheet was prepared as an insulating sheet in which an about 6 μm-thick copper foil was attached to one surface of an about 50 μm-thick LCP sheet and an about 25 μm-thick PET sheet was attached to the other surface. The copper-clad sheet was irradiated with carbon dioxide laser to form an opening and a via hole each having a diameter of about 100 μm. A via conductor made of plated copper was formed in the via hole. The opening in the PET film was filled with the prepared conductive paste, such that a conductive paste layer was formed on the via conductor. The PET sheet was removed from the LCP sheet. Ten such LCP sheets in total were stacked together such that the order was reversed between the fifth and sixth layers, and were pressed at high pressure at a temperature of about 300° C. Separately, six LCP sheets in total from which the PET sheets were removed were stacked together such that the order was reversed between the third and fourth layers, and were pressed at high pressure at a temperature of about 300° C. As described above, two kinds of multilayer wiring boards were produced.

Reference Example 1

Unlike Example 1, a conductive paste layer that would turn into a bonding layer was not formed in Reference Example 1. Also, in Reference Example 1, a via hole was filled with the conductive paste to form a via conductor made of a sintered conductive paste, instead of forming a via conductor made of plated copper. Except for these points, the method of Example 1 was repeated to produce two kinds of multilayer wiring boards.

Table 1 shows DC resistance (DCR) values of the via conductors in Example 1 and Reference Example 1. Table 1 shows initial resistance values and resistance values after 30 minutes of heat treatment at about 245° C.

TABLE 1

| | | Example 1 Plated via | | Reference Example 1 Paste via | |
|---|---|---|---|---|---|
| | | Number of layers | | | |
| | | 6 layers | 10 layers | 6 layers | 10 layers |
| DCR | Initial/Ω | 0.006 | 0.007 | 0.041 | 0.065 |
| | 245° C. for 30 min/Ω | 0.008 | 0.008 | 0.041 | 0.065 |

Table 1 shows that electrical connection is achieved in Example 1 because bonding is achieved between the via conductors in each layer and between the conductive wiring layer and the via conductor by the bonding layer. Table 1 also shows that the resistance is lower in Example 1 including the via conductors made of plated metal than in Reference Example 1 including the via conductors made of a sintered conductive paste.

A cross section of the multilayer wiring board produced in Example 1 was subjected to elemental analysis by wavelength-dispersive X-ray spectroscopy (WDX).

Figure 12A:
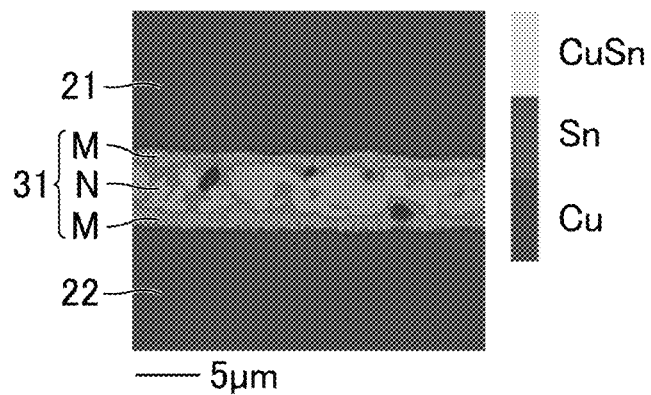
FIG. 12A is a mapping image of CuSn, Sn, and Cu in and around the bonding layer of a multilayer wiring board produced in Example 1.
Figure 12B:
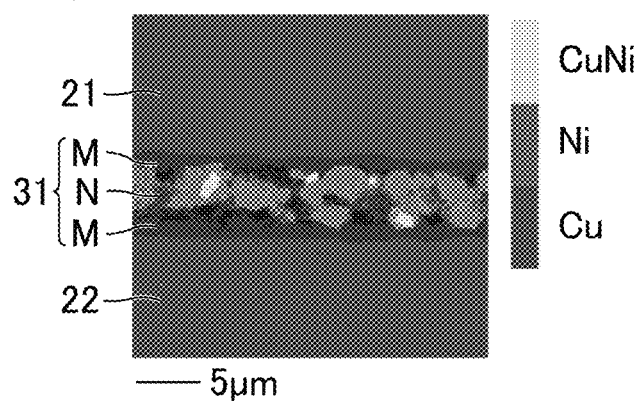
FIG. 12B is a mapping image of CuNi, Ni, and Cu at the same site as in FIG. 12A.

FIG. 12A is a mapping image of CuSn, Sn, and Cu in and around the bonding layer of a multilayer wiring board produced in Example 1. FIG. 12B is a mapping image of CuNi, Ni, and Cu at the same site as in FIG. 12A.

As shown in FIG. 12A, the bonding layer 31 includes an intermetallic compound layer M including a Cu component and a Sn component on its interface with the via conductor 21 and on its interface with the via conductor 22. Further, as shown in FIG. 12B, the bonding layer 31 includes an intermetallic compound layer N including a Cu component and a Ni component between the intermetallic compound layers M. In other words, the bonding layer has a three-layered structure sequentially including the intermetallic compound layer M containing a Cu component and a Sn component, the intermetallic compound layer N containing a Cu component and a Ni component, and the intermetallic compound layer M containing a Cu component and a Sn component.

As described above, in the multilayer wiring board according to the first preferred embodiment of the present invention, the bonding layer preferably includes the intermetallic compound layer M including a Cu component and a Sn component at least at its interface with the via conductor or the conductive wiring layer.

Also, the bonding layer preferably sequentially includes the intermetallic compound layer M containing a Cu component and a Sn component, the intermetallic compound layer N containing a Cu component and one of a Ni component or a Mn component, and the intermetallic compound layer M. An intermetallic compound including a Cu component and a Ni component or an intermetallic compound including a Cu component and a Mn component each have a melting point higher than the melting point of the intermetallic compound containing a Cu component and a Sn component. Thus, the presence of the intermetallic compound layer N between the intermetallic compound layers M improves reliability.

As shown in FIGS. 12A and 12B, preferably, the composition gradually changes without clear boundary between the interface between the intermetallic compound layer M and the intermetallic compound layer N.

In this case, stress is dispersed, increasing the fracture strength against external stress.

The intermetallic compound layer M may include a third component other than a Cu component and a Sn component. The intermetallic compound layer N may include a third component other than a Cu component and a Ni component, or a third component other than a Cu component or a Mn component.

In the first preferred embodiment of the present invention, electrical connection is achieved between the via conductors in each layer and between the conductive wiring layer and the via conductor by the bonding layer, thus providing low resistance.

Further, the intermetallic compound layer is formed between the via conductors in each layer and between the conductive wiring layer and the via conductor, thus achieving chemical physical connection. The bonding layer has a melting point of about 400° C. or higher (e.g., about 430° C.). Thus, degradation from environmental testing such as high-temperature and high-humidity testing and heat cycles can be reduced or prevented.

Second Preferred Embodiment

In the second preferred embodiment of the present invention, the conductive paste used to form the bonding layer preferably includes particles of a first metal and nanoparticles of a second metal, and the first metal and the second metal are each preferably independently Cu or Ag, for example.

Figure 13A:
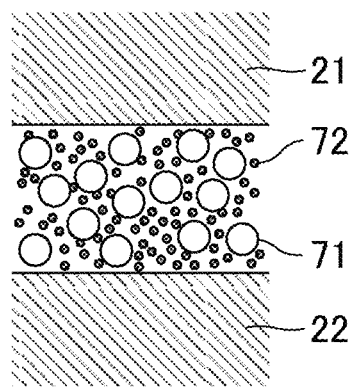
FIGS. 13A and 13B are each a schematic view of how a bonding layer is formed using a conductive paste according to a second preferred embodiment of the present invention.
Figure 13B:
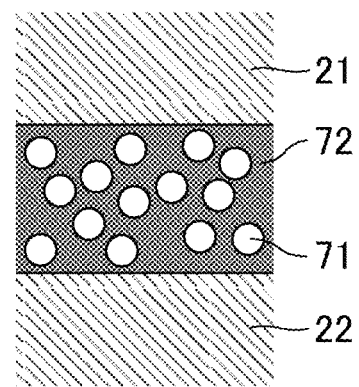

FIGS. 13A and 13B are each a schematic view of how a bonding layer is formed using a conductive paste according to the second preferred embodiment of the present invention.

FIG. 13A shows a state before heating, and a conductive paste including particles of a first metal 71 and nanoparticles of a second metal 72 is present between the via conductor 21 and the via conductor 22. When heating is performed in this state, as shown in FIG. 13B, nanoparticles of the second metal 72 melt at a temperature lower than about 400° C., thus forming a sintered metal layer.

A similar reaction as described above occurs to form a sintered metal layer also when a conductive paste including particles of the first metal and nanoparticles of the second metal is disposed between the conductive wiring layer and the via conductor.

As described above, in the second preferred embodiment of the present invention, bonding is achieved between the via conductors or between the conductive wiring layer and the via conductor by the sintered metal layer.

The first metal in the conductive paste is preferably Cu or Ag, for example. The conductive paste may include two or more kinds of particles having different average particle sizes as the particles of the first metal.

The average particle size of the particles of the first metal is not limited, but it is preferably about 300 nm or more and is also preferably about 2000 nm or less, for example.

The average particle size of the particles of the first metal is the cumulative particle size at 50% in a volume cumulative particle size distribution curve. The average particle size can be measured by, for example, using a laser diffraction/scattering particle size distribution analyzer (MT3300-EX available from MicrotracBEL Corp.). The average particle size of the nanoparticles of the second metal described below can also be measured in the same or similar manner.

The second metal in the conductive paste is preferably Cu or Ag, for example. The second metal may be the same as or different from the first metal. Thus, examples of combinations of the first metal and the second metal include a combination of Cu and Ag, a combination of Ag and Ag, a combination of Ag and Cu, and a combination of Cu and Cu. The conductive paste may include two or more kinds of nanoparticles having different average particle sizes as the nanoparticles of the second metal.

The average particle size of the nanoparticles of the second metal is not limited, but it is preferably about 150 nm or less, more preferably about 100 nm or less, for example. The average particle size of the nanoparticles of the second metal may preferably be, for example, about 3 nm or more.

The conductive paste according to the second preferred embodiment of the present invention may be, for example, one of commercially available conductive pastes shown in Table 2.

TABLE 2

| Product name | Manufacturer | Metal particles 1 | | Metal particles 2 | | Metal particles 3 | |
| --- | --- | --- | --- | --- | --- | --- | --- |
| | | Metal species | Particle size/nm | Metal species | Particle size/nm | Metal species | Particle size/nm |
| Alconano paste ANP-1 | Nihon Superior Co., Ltd. | Ag | 3-20 | Ag | 20-100 | Ag | 300-2000 |
| Alconano paste ANP-4 | Nihon Superior Co., Ltd. | Ag | 3-20 | Ag | 20-100 | Cu | 300-2000 |

Example 2

A copper-clad sheet was prepared as an insulating sheet in which 6 μm-thick copper foil was attached to one surface of a 50 μm-thick LCP sheet and a 25 μm-thick PET sheet was attached to the other surface. The copper-clad sheet was irradiated with carbon dioxide laser to form an opening and a via hole each having a diameter of about 100 μm. A via conductor made of plated copper was formed in the via hole. The opening in the PET film was filled with a conductive paste "ANP-4" available from Nihon Superior Co., Ltd. (see Table 2), such that a conductive paste layer was formed on the via conductor. The PET sheet was removed from the LCP sheet. Ten such LCP sheets in total were stacked together such that the order was reversed between the fifth and sixth layers, and were pressed at high pressure at a temperature of about 300° C. As described above, a multilayer wiring board was produced.

A cross section of the multilayer wiring board produced in Example 2 was subjected to elemental analysis by wavelength-dispersive X-ray spectroscopy (WDX).

Figure 14A:
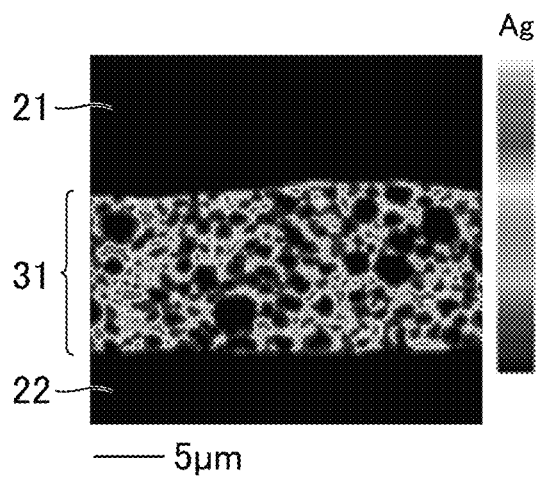
FIG. 14A is a mapping image of Ag in and around the bonding layer of a multilayer wiring board produced in Example 2.
Figure 14B:
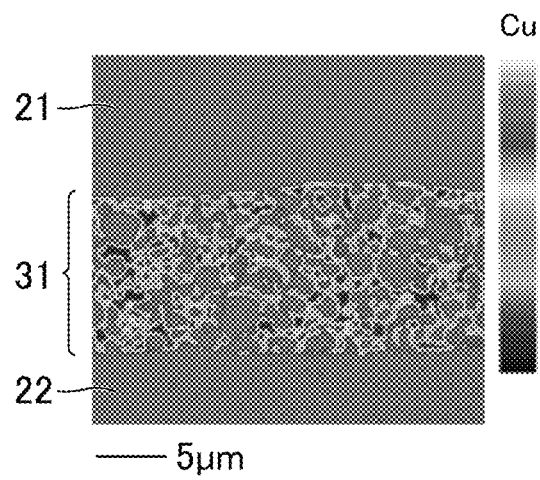
FIG. 14B is a mapping image of Cu at the same site as in FIG. 14A.

FIG. 14A is a mapping image of Ag in and around the bonding layer of a multilayer wiring board produced in Example 2. FIG. 14B is a mapping image of Cu at the same site as in FIG. 14A.

As shown in FIGS. 14A and 14B, the bonding layer 31 is a sintered metal layer made of a sintered body of Cu and Ag, and Cu particles are dispersed in a sea-island form in molten Ag. Interfacial metal bonding is achieved between the via conductor 21 and the bonding layer (sintered metal layer) 31 and between the via conductor 22 and the bonding layer 31.

As described above, in the multilayer wiring board according to the second preferred embodiment of the present invention, the bonding layer includes a sintered metal layer including at least one of Cu or Ag. Preferably, Interfacial metal bonding is achieved between the via conductor or the conductive wiring layer and the sintered metal layer.

In the second preferred embodiment of the present invention, electrical connection is achieved between the via conductors in each layer and between the conductive wiring layer and the via conductor by the bonding layer, thus providing low resistance.

Further, chemical physical connection is achieved between the via conductors in each layer and between the conductive wiring layer and the via conductor, with the nanoparticles as molten bulk metal. The bonding layer has a melting point comparable to the melting point of the bulk metal (Ag: 961° C.; Cu: 1083° C.). Thus, degradation from environmental testing such as high-temperature and high-humidity testing and heat cycles can be reduced or prevented.

Third Preferred Embodiment

In the third preferred embodiment of the present invention, the conductive paste used to form the bonding layer includes Cu particles preferably having, for example, a particle size peak in the particle size distribution of about 0.1 µm or more and about 5.0 µm or less and an average crystallite diameter of about 10 nm or more and about 100 nm or less.

Figure 15A:
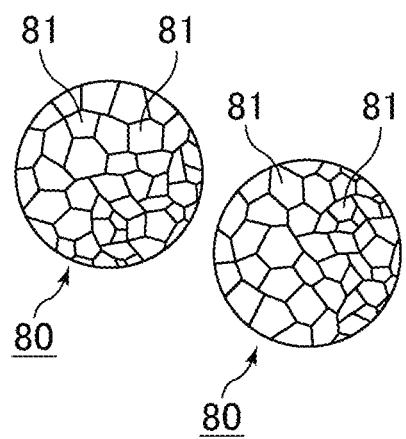
FIGS. 15A and 15B are each a schematic view of a sintering process of Cu particles.
Figure 15B:
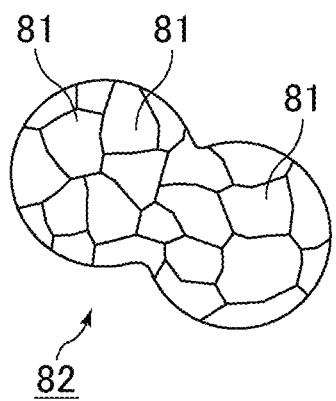

FIGS. 15A and 15B are each a schematic view of a sintering process of Cu particles.

As shown in FIG. 15A, each Cu particle 80 is formed of crystallites 81 having a small average size (average crystallite diameter) of about 10 nm or more and about 100 nm or less, for example, and has high grain boundary energy. When heating is performed in this state, neck growth occurs in the Cu particles 80 each having a small average crystallite diameter and high grain boundary energy even at a low temperature of, for example, about 350° C. or lower. Thus, as shown in FIG. 15B, the Cu particles are united together, resulting in a large crystallite diameter. As a result, the Cu particles themselves become larger, and the average crystallite diameter also increases to, for example, about 60 nm or more and, for example, about 150 nm or less, for example, resulting in formation of stable sintered Cu particles 82.

As described above, in the third preferred embodiment of the present invention, bonding is achieved between the via conductors or between the conductive wiring layer and the via conductor by the sintered Cu particles.

The conductive paste according to the third preferred embodiment of the present invention may preferably be, for example, a copper particle paste disclosed in WO 2015/118982.

The particle size peak in the particle size distribution of the Cu particles in the conductive paste is preferably about 0.1 µm or more and about 5.0 µm or less, for example.

The particle size peak in the particle size distribution of the Cu particles is determined by the following method. First, the Cu particles are observed using a scanning electron microscope, and the horizontal feret diameter of each of 200 particles in the viewing field is measured. The resulting measurements are converted to spherical diameters, and the volume average particle size is calculated so as to determine the particle size peak.

The average crystallite diameter of the Cu particles in the conductive paste is about 10 nm or more and about 100 nm or less, preferably about 30 nm or more and about 100 nm or less, for example.

The average crystallite diameter before sintering is determined by the following method. First, X-ray diffraction measurement is performed on the Cu particles, such that three peaks <111>, <200>, and <311> are obtained. Using these three peaks, crystallite diameters are calculated by the Rietveld method, and averaged to determine the average crystallite diameter.

The average crystallite diameter of the Cu particles after sintering is preferably about 60 nm or more and about 150 nm or less, for example.

The average crystallite diameter after sintering is determined by the same method as that for the average crystallite diameter before sintering.

Preferably, no dispersant that reduces or prevents coagulation is present on the surface of each Cu particle in the conductive paste. Examples of such a dispersant include a dispersion stabilizer disclosed in JP 2013-91835 A.

When no dispersant that reduces or prevents coagulation is present on the surface of the Cu particle, a sintered body having a high density and a low porosity can be obtained.

Preferably, the conductive paste further includes an organic compound that causes reduction at a temperature of sintering the Cu particles.

Copper oxide on the surface of the Cu particles, which acts as hindering factors to sintering, is reduced by the reducing effect of the organic compound, so that a reducing atmosphere is not particularly required for sintering, and sintering can be performed in an inert atmosphere.

The organic compound is preferably a reducing organic compound including a group such as a hydroxy group or an aldehyde group, for example.

Use of a reducing organic compound including a group such as a hydroxy group or an aldehyde group enables removal of an oxide film formed on the surface of the Cu particles and also enables reliable sintering without causing oxidation of Cu.

The organic compound preferably includes at least one selected from the group consisting of triethanolamine, glycerol, ethylene glycol, triethylene glycol, diethylene glycol, and dipropylene glycol, for example.

Another organic compound can also be used as the organic compound that causes reduction. The organic compound that causes reduction is preferably an organic compound that is a liquid at room temperature. Yet, in some cases, a substance that is a solid at room temperature can be used. In such a case, the substance can be used after being dissolved in another solvent, if necessary.

In the bonding layer made of sintered Cu particles, preferably, the pores in the sintered body and the periphery of the sintered body are filled with an organic compound such as a resin, for example, in order to improve adhesion between the sintered bodies, between the sintered body and the via conductor, and between the sintered body and the insulating layer and also to improve environment resistance such as oxidation resistance.

In the method of producing the multilayer wiring board according to the third preferred embodiment of the present invention, in the collectively compressing multiple insulating sheets, the heat treatment temperature preferably reaches about 200° C. or higher, for example, for at least a certain period of time. At a heat treatment temperature of 200° C. or higher, when the conductive paste includes a reducing organic compound, an oxide film formed on the surface of the Cu particles can be removed, and also the copper can be reliably sintered without being oxidized during sintering. The highest heat treatment temperature is preferably about 350° C. or lower, for example. When the highest heat treatment temperature is higher than about 350° C., it may cause outflow of resin such as, for example, a liquid crystal polymer (LCP) defining the insulating sheet.

Example 3

First, Cu particles having a particle size peak in the particle size distribution of about 0.1 µm or more and about 5.0 µm or less and an average crystallite diameter of about 10 nm or more and about 100 nm or less were prepared. In addition, triethanolamine which is a liquid at room temperature was prepared as an organic compound that causes reduction. The Cu particles and triethanolamine were mixed at a weight ratio of about 87:13 and the mixture was kneaded, such that a conductive paste was prepared.

A copper-clad sheet was prepared as an insulating sheet in which an about 6 µm-thick copper foil was attached to one surface of an about 50 µm-thick LCP sheet and an about 25 µm-thick PET sheet was attached to the other surface. The copper-clad sheet was irradiated with carbon dioxide laser to form an opening and a via hole each having a diameter of about 100 µm. A via conductor made of plated copper was formed in the via hole. The opening in the PET film was filled with the prepared conductive paste, such that a conductive paste layer was formed on the via conductor. The PET sheet was removed from the LCP sheet. Ten such LCP sheets in total were stacked together such that the order was reversed between the fifth and sixth layers, and were pressed at high pressure at a temperature of about 300° C. As described above, a multilayer wiring board was produced.

A cross section of the multilayer wiring board produced in Example 3 was observed using a scanning electron microscope (SEM).

Figure 16:
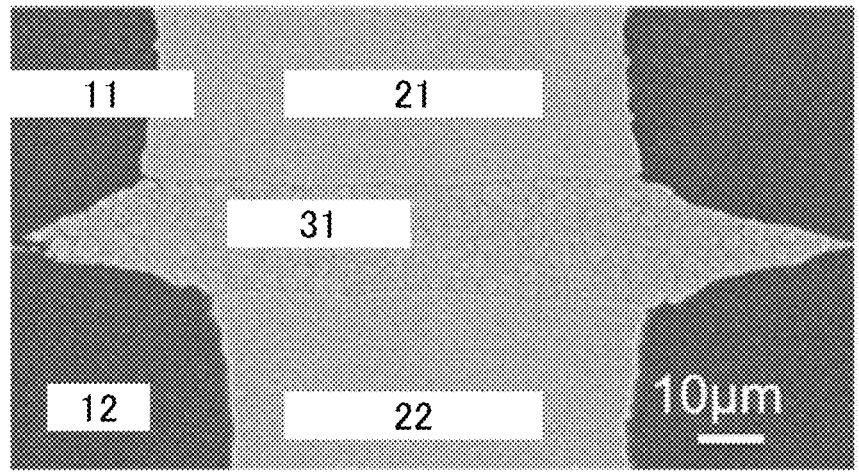
FIG. 16 is an SEM image of a bonding layer and its vicinity of a multilayer wiring board produced in Example 3.
Figure 17:
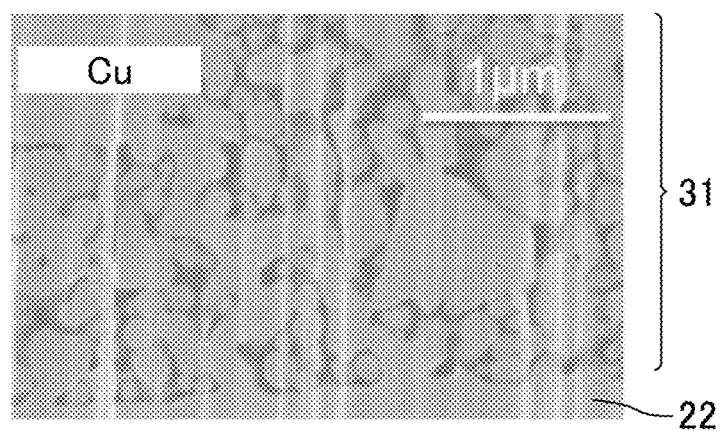
FIG. 17 is an SEM image of the bonding layer of the multilayer wiring board produced in Example 3.

FIG. 16 is an SEM image of a bonding layer and its vicinity of a multilayer wiring board produced in Example 3. FIG. 17 is an SEM image of the bonding layer of the multilayer wiring board produced in Example 3.

As shown in FIG. 16, the via conductor 21 inside the first insulating layer 11 is bonded to the via conductor 22 inside the second insulating layer 12 by the bonding layer 31 made of sintered Cu particles. Further, as shown in FIG. 17, the Cu particles are sintered and metal-bonded in the bonding layer 31. Interfacial metal bonding is also achieved between the via conductor 22 and the bonding layer 31, which indicates formation of a highly reliable bonding layer.

As described above, in the multilayer wiring board according to the third preferred embodiment of the present invention, the bonding layer includes a sintered metal layer made of sintered Cu particles. Specifically, the Cu particles preferably have an average crystallite diameter of about 60 nm or more and about 150 nm or less, for example. Preferably, interfacial metal bonding is achieved between the via conductor or the conductive wiring layer and the sintered metal layer.

In the third preferred embodiment of the present invention, the conductive paste preferably includes Cu particles having a particle size peak in the particle size distribution of about 0.1 µm or more and about 5.0 µm or less and an average crystallite diameter of about 10 nm or more and about 100 nm or less, for example. Thus, the Cu particles can be sintered together at a temperature of about 350° C. or lower. Thus, a multilayer wiring board can be produced by collective multilayer pressing with resin materials such as a liquid crystal polymer (LCP), for example.

In the third preferred embodiment of the present invention, electrical connection is achieved between the via conductors in each layer and between the conductive wiring layer and the via conductor by the bonding layer, thus providing low resistance.

Further, since the bonding layer is preferably made of sintered Cu particles having a high melting point, the resulting multilayer product has high heat resistance of about 400° C. or higher. Thus, high reliability is achieved, and degradation from environmental testing such as high-temperature and high-humidity testing and heat cycles can be reduced or prevented.

Other Preferred Embodiments

The multilayer wiring boards, the electronic devices, and the methods of producing the multilayer wiring boards of the present invention are not limited to the above preferred embodiments, and various modifications and changes may be made to the configurations of the multilayer wiring boards and the electronic devices, production conditions, and the like, within the scope of the present invention.

For example, in the multilayer wiring boards of preferred embodiments of the present invention, the bonding layer may be made of an alloy such as an Au—Sn alloy, a Pt—Sn alloy, a Pb—Sn alloy, or an In—Sn alloy.

In the methods of producing the multilayer wiring boards of preferred embodiments of the present invention, in FIG. 6F, the via conductors each including a conductive paste layer formed thereon oppose each other. Yet, the multilayer wiring boards may be configured such that a via conductor including a conductive paste layer formed thereon opposes a via conductor not having a conductive paste layer formed thereon.

The above-described examples specifically disclose the preferred embodiments, but the present invention is not limited to these examples.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer wiring board comprising:
a first insulating layer;
a second insulating layer stacked on the first insulating layer;
a via conductor inside each of the first insulating layer and the second insulating layer; and
a conductive bonding layer to bond the via conductors to each other; wherein
a conductivity of the bonding layer is lower than a conductivity of the via conductors;
the first insulating layer is directly bonded to the second insulating layer;
the via conductors are directly bonded to the bonding layer;
a relationship a1>b1 is satisfied, where a1 is a maximum diameter of the bonding layer and b1 is a maximum diameter of the via conductors at an interface with the bonding layer;

the maximum diameter a1 of the bonding layer corresponds to a maximum length of the bonding layer in a plan view in a stacking direction of the first and second insulating layers;

the maximum diameter b1 of the via conductors corresponds to a maximum length of the via conductors at the interface with the bonding layer in the plan view in the stacking direction; and the via conductors have a metal content of about 99 wt % or more.

2. The multilayer wiring board according to claim 1, wherein a relationship t1<T1 is satisfied, where t1 is a maximum thickness of the bonding layer and T1 is a maximum thickness of the via conductors.

3. A multilayer wiring board comprising:
a first insulating layer;
a third insulating layer stacked on the first insulating layer;
a conductive wiring layer on a surface of the first insulating layer on a side facing the third insulating layer;
a via conductor inside the third insulating layer; and
a conductive bonding layer to bond the conductive wiring layer to the via conductor; wherein
a conductivity of the bonding layer is lower than a conductivity of the via conductor;
the first insulating layer is directly bonded to the third insulating layer;
in a direction perpendicular or substantially perpendicular to a stacking direction of the first and third insulating layers, a dimension of the bonding layer is smaller than a dimension of the conductive wiring layer;
a relationship a2>b2 is satisfied, where a2 is a maximum diameter of the bonding layer, and b2 is a maximum diameter of the via conductor at an interface with the bonding layer;
the maximum diameter a2 of the bonding layer corresponds to a maximum length of the bonding layer in a plan view in the stacking direction;
the maximum diameter b2 of the via conductor corresponds to a maximum length of the via conductor at the interface with the bonding layer in the plan view in the stacking direction; and
the via conductor has a metal content of about 99 wt % or more.

4. The multilayer wiring board according to claim 3, wherein a relationship t2<T2 is satisfied, where t2 is a maximum thickness of the bonding layer, and T2 is a maximum thickness of the via conductor.

5. The multilayer wiring board according to claim 1, wherein the bonding layer includes an intermetallic compound layer M including a Cu component and a Sn component at an interface with at least one of the via conductors.

6. The multilayer wiring board according to claim 1, wherein the bonding layer sequentially includes an intermetallic compound layer M including a Cu component and a Sn component, an intermetallic compound layer N including a Cu component and one of a Ni component or a Mn component, and the intermetallic compound layer M.

7. The multilayer wiring board according to claim 1, wherein the bonding layer includes a sintered metal layer including at least one of Cu or Ag.

8. The multilayer wiring board according to claim 7, wherein an interfacial metal bond is present between at least one of the via conductors and the sintered metal layer.

9. The multilayer wiring board according to claim 7, wherein the sintered metal layer is made of a sintered body of a first metal and a second metal, the first metal and the second metal are each one of Cu or Ag, and particles of the first metal are dispersed in a sea-island configuration in the second metal.

10. The multilayer wiring board according to claim 7, wherein the sintered metal layer is made of sintered Cu particles having an average crystallite diameter of about 60 nm or more and about 150 nm or less.

11. The multilayer wiring board according to claim 1, wherein at least one of the first insulating layer or the second insulating layer is made of thermoplastic resin.

12. The multilayer wiring board according to claim 1, wherein the first insulating layer and the second insulating layer each include one layer.

13. The multilayer wiring board according to claim 12, wherein the via conductor inside the first insulating layer and the via conductor inside the second insulating layer are each made of plated metal.

14. The multilayer wiring board according to claim 1, wherein one of the first insulating layer or the second insulating layer includes one layer, and another one of the first insulating layer or the second insulating layer includes two or more layers.

15. The multilayer wiring board according to claim 14, wherein the via conductor inside the insulating layer including one layer is made of plated metal, and the via conductor inside the insulating layer including two or more layers is a metal pin.

16. The multilayer wiring board according to claim 3, wherein the third insulating layer includes one layer.

17. The multilayer wiring board according to claim 16, wherein the via conductor inside the third insulating layer is made of plated metal.

18. The multilayer wiring board according to claim 3, wherein the third insulating layer includes two or more layers.

19. The multilayer wiring board according to claim 18, wherein the via conductor inside the third insulating layer is a metal pin.

20. The multilayer wiring board according to claim 1, wherein the multilayer wiring board has an overall thickness greater than an overall width thereof.

21. An electronic device comprising:
a first circuit board;
a second circuit board; and
an interposer between the first circuit board and the second circuit board; wherein
the interposer includes multiple terminals;
the interposer is defined by the multilayer wiring board according to claim 1; and
the first circuit board and the second circuit board are electrically connected to the via conductors in the multilayer wiring board.

22. The electronic device according to claim 21, wherein the interposer allows high frequency signals to pass therethrough.

23. The electronic device according to claim 21, wherein
the first circuit board is an antenna; and
the second circuit board is a control board on which a high frequency integrated circuit is mounted.

24. A method of producing the multilayer wiring board according to claim 1, comprising:
preparing an insulating sheet having conductive foil attached to one surface thereof and a protection film attached to another surface thereof;
forming, from a side of the protection film, an opening that penetrates through the protection film and also forming a via hole that penetrates through the insulating sheet to the conductive foil;

forming a via conductor in the via hole in the insulating sheet;

forming a conductive paste layer having a maximum diameter greater than the maximum diameter of the via conductor exposed to a surface of the insulating sheet by applying a conductive paste to the via conductor; and stacking a plurality of the insulating sheets each including the via conductor and the conductive paste layer, and collectively compressing the plurality of insulating sheets by heat treatment.

25. The method of producing the multilayer wiring board according to claim 24, wherein the forming the conductive paste layer includes filling the opening in the protection film with the conductive paste to form the conductive paste layer and then removing the protection film.

26. The method of producing the multilayer wiring board according to claim 24, wherein the opening in the protection film and the via hole in the insulating sheet each have a tapered shape with a diameter that decreases toward the conductive foil.

27. The method of producing the multilayer wiring board according to claim 26, wherein the opening has a taper angle greater than a taper angle of the via hole.

28. The method of producing the multilayer wiring board according to claim 24, wherein the conductive paste includes metal powder of Sn or a Sn alloy and metal powder of a Cu—Ni or Cu—Mn alloy.

29. The method of producing the multilayer wiring board according to claim 24, wherein the conductive paste includes particles of a first metal and nanoparticles of a second metal, and the first metal and the second metal are each one of Cu or Ag.

30. The method of producing the multilayer wiring board according to claim 25, wherein the conductive paste includes Cu particles having a particle size peak in a particle size distribution of about 0.1 μm or more and about 5.0 μm or less and an average crystallite diameter of about 10 nm or more and about 100 nm or less.

* * * * *